(12) United States Patent
Jin

(10) Patent No.: US 11,335,750 B2
(45) Date of Patent: May 17, 2022

(54) ORGANIC LIGHT EMITTING DIODE (OLED) DISPLAY PANEL AND OLED DISPLAY DEVICE

(71) Applicant: Wuhan China Star Optoelectronics Semiconductor Display Technology Co., Ltd., Wuhan (CN)

(72) Inventor: Jiangjiang Jin, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/476,276

(22) PCT Filed: Mar. 14, 2019

(86) PCT No.: PCT/CN2019/078159
§ 371 (c)(1),
(2) Date: Jul. 6, 2019

(87) PCT Pub. No.: WO2020/133720
PCT Pub. Date: Jul. 2, 2020

(65) Prior Publication Data
US 2021/0359051 A1    Nov. 18, 2021

(30) Foreign Application Priority Data

Dec. 26, 2018    (CN) .......................... 201811603829.5

(51) Int. Cl.
*H01L 27/32*    (2006.01)
*H01L 51/52*    (2006.01)

(52) U.S. Cl.
CPC ........ *H01L 27/3258* (2013.01); *H01L 27/323* (2013.01); *H01L 51/5237* (2013.01)

(58) Field of Classification Search
CPC ............... H01L 27/3258; H01L 27/323; H01L 51/5237
See application file for complete search history.

(56) References Cited

U.S. PATENT DOCUMENTS

| | | | |
|---|---|---|---|
| 10,361,254 B2 | 7/2019 | Park et al. | |
| 10,804,338 B2 | 10/2020 | Park et al. | |
| 10,963,076 B2 | 3/2021 | Choi et al. | |
| 10,983,652 B2 * | 4/2021 | Jung | G06F 1/1684 |

(Continued)

FOREIGN PATENT DOCUMENTS

| | | |
|---|---|---|
| CN | 107230680 A | 10/2017 |
| CN | 107665912 A | 2/2018 |
| CN | 107946341 A | 4/2018 |

*Primary Examiner* — Bitew A Dinke
(74) *Attorney, Agent, or Firm* — Nathan & Associates; Menachem Nathan

(57) ABSTRACT

The present invention provides an organic light-emitting diode (OLED) display panel and an OLED display device. The OLED display panel comprises a light transmission area and a display area surrounding a periphery of the light transmission area; a concave groove is disposed in the OLED display panel corresponding to the light transmission area, and the concave groove penetrates through at least an encapsulation layer, a light emitting function layer and a part of a thin film transistor (TFT) structure layer; and at least a part of a touch function layer extends from the display area toward the concave groove and covers the concave groove.

18 Claims, 2 Drawing Sheets

(56) References Cited

U.S. PATENT DOCUMENTS

| | | | |
|---|---|---|---|
| 2015/0028328 A1 | 1/2015 | Ikeda et al. | |
| 2015/0034935 A1* | 2/2015 | Choi | H01L 51/5253 257/40 |
| 2015/0069362 A1 | 3/2015 | Ito | |
| 2016/0093827 A1* | 3/2016 | Han | H01L 27/3244 257/40 |
| 2016/0233289 A1* | 8/2016 | Son | H01L 51/52 |
| 2017/0237037 A1* | 8/2017 | Choi | H01L 27/323 257/40 |
| 2017/0262109 A1* | 9/2017 | Choi | H01L 51/5253 |
| 2017/0287992 A1* | 10/2017 | Kwak | G06F 1/1686 |
| 2018/0159075 A1* | 6/2018 | Kim | H01L 29/78603 |
| 2019/0095007 A1* | 3/2019 | Jeong | H01L 27/323 |
| 2019/0214601 A1* | 7/2019 | Park | H01L 27/3272 |
| 2019/0393444 A1* | 12/2019 | Nam | H01L 51/5253 |
| 2020/0110525 A1* | 4/2020 | Park | G06F 3/044 |
| 2020/0127220 A1* | 4/2020 | Kim | H01L 51/107 |
| 2020/0127233 A1* | 4/2020 | Sung | H01L 21/76205 |
| 2020/0142525 A1* | 5/2020 | Han | G06F 1/1626 |
| 2020/0159369 A1* | 5/2020 | Seo | H01L 27/3276 |
| 2020/0236259 A1* | 7/2020 | Nakamura | G02F 1/133345 |
| 2021/0028242 A1 | 1/2021 | Park et al. | |

* cited by examiner

ORGANIC LIGHT EMITTING DIODE (OLED) DISPLAY PANEL AND OLED DISPLAY DEVICE

BACKGROUND OF INVENTION

Field of Invention

The present invention relates to a display technology, and in particular, to an organic light emitting diode (OLED) display panel and an OLED display device.

Description of Prior Art

With gradual maturity of organic light emitting diode (OLED) technology, higher and higher requirements have been put forward on reliability of OLEDs, such as narrow bezel technologies, panel manufacturers realize OLED displays with bezel sizes of less than 2 mm through chip on film (COF) and/or chip on plastic (COP) technologies, resulting in a higher screen ratio when a camera is placed in a light emitting area of the OLED.

In existing display panels, a built-in camera is generally set in a lower part of a display area, and a place for setting the camera is provided by cutting through the entire device by a laser from top to bottom or from bottom to top after completing the whole OLED process to form a through hole, and the camera is disposed in a region corresponding to the through hole, thereby realizing a display area technology of built-in camera with 100% transmittance. However, this method cannot prevent water and oxygen from eroding an OLED electrode and material from a lateral side.

SUMMARY OF INVENTION

An embodiment of the present invention provides an organic light emitting diode (OLED) display panel and an OLED display device to solve the technical problem that the existing OLED display panel cannot avoid lateral erosion of an OLED electrode and the material after an opening process of the OLED display panel.

An embodiment of the present invention provides an OLED display panel, including a thin film transistor (TFT) structure layer, a light emitting functional layer, and an encapsulation layer, which are sequentially disposed on a substrate, wherein the OLED display panel comprises a light transmission area and a display area surrounding a periphery of the light transmission area; a concave groove is disposed in the OLED display panel corresponding to the light transmission area, and the concave groove penetrates through at least the encapsulation layer, the light emitting functional layer and a part of the TFT structure layer; and a touch functional layer is disposed on the encapsulation layer, wherein the touch functional layer covers the display area, and at least a part of the touch functional layer extends from the display area toward the concave groove and covers the concave groove; and the OLED display panel comprises a substrate, wherein the substrate comprises a first portion and a second portion, the first portion corresponds to the display area, the second portion corresponds to the light transmission area, and a thickness of the second portion is less than a thickness of the first portion.

In the OLED display panel of the present invention, the touch functional layer comprises a first insulating layer, a first touch electrode, a second insulating layer and a second touch electrode, wherein the first insulating layer is disposed on the encapsulation layer, the first touch electrode is disposed on the first insulating layer, the second insulating layer is disposed on the first touch electrode, and the second touch electrode is disposed on the second insulating layer; wherein the first insulating layer or/and the second insulating layer covers the concave groove.

In the OLED display panel of the present invention, a convex groove protrudes from a bottom surface of the substrate corresponding to the light transmission area to form the second portion.

In the OLED display panel of the present invention, the convex groove and the concave groove are disposed on a same central axis.

In the OLED display panel of the present invention, an orthographic projection area of the convex groove on a plane of the substrate is smaller than an orthographic projection area of the concave groove on the plane of the substrate.

In the OLED display panel of the present invention, an included angle between a bottom surface and a sidewall surface of the concave groove is an obtuse included angle in a longitudinal section of the concave groove.

In the OLED display panel of the present invention, the TFT structure layer comprises a buffer layer, an active layer, a first gate insulating layer, a first gate metal layer, a second gate insulating layer, a second gate metal layer, a third insulating layer, a source/drain metal layer, and a planarization layer sequentially disposed on the substrate; the light emitting functional layer comprises a first electrode, a pixel isolation layer, a light emitting layer, and a second electrode layer sequentially disposed on the planarization layer; and the light transmission area comprises the buffer layer, the first gate insulating layer, the second gate insulating layer, and the third insulating layer of the TFT structure layer, and the concave groove penetrates through the encapsulation layer, the light emitting functional layer, and the planarization layer.

In the OLED display panel of the present invention, the display region comprises the buffer layer, the active layer, the first gate insulating layer, the first gate metal layer, and the second gate insulating layer, the second gate metal layer, the third insulating layer, the source/drain metal layer and the planarization layer of the TFT structure layer, and comprises the first electrode, the pixel isolation layer, the light emitting layer and the second electrode layer of the light emitting functional layer, wherein the encapsulation layer is disposed on the second electrode layer.

Another embodiment of the present invention provides an organic light emitting diode (OLED) display panel, comprising a thin film transistor (TFT) structure layer, a light emitting functional layer and an encapsulation layer sequentially disposed on a substrate, wherein the OLED display panel comprises a light transmission area and a display area surrounding a periphery of the light transmission area; and a concave groove is disposed in the OLED display panel corresponding to the light transmission area, and the concave groove penetrates through at least the encapsulation layer, wherein a touch functional layer is disposed on the encapsulation layer, and the touch functional layer covers the display area, and at least a part of the touch functional layer extends from the display area toward the concave groove and covers the concave groove.

In the OLED display panel of the present invention, the concave groove further penetrates through the light emitting functional layer and a part of the TFT structure layer.

In the OLED display panel of the present invention, the touch functional layer comprises a first insulating layer, a first touch electrode, a second insulating layer and a second touch electrode, wherein the first insulating layer is disposed on the encapsulation layer, the first touch electrode is disposed on the first insulating layer, the second insulating layer is disposed on the first touch electrode, and the second touch electrode is disposed on the second insulating layer; wherein the first insulating layer or/and the second insulating layer covers the concave groove.

In the OLED display panel of the present invention, the first insulating layer or/and the second insulating layer is a multilayered structure or a single layer structure.

In the OLED display panel of the present invention, the OLED display panel comprises a substrate, and the substrate comprises a first portion and a second portion, the first portion corresponding to the display area, the second portion corresponding to the light transmission area; and a thickness of the second portion is less than a thickness of the first portion.

In the OLED display panel of the present invention, a convex groove protrudes from a bottom surface of the substrate corresponding to the light transmission region to form the second portion.

In the OLED display panel of the present invention, the convex groove and the concave groove are disposed on a same central axis.

In the OLED display panel of the present invention, an orthographic projection area of the convex groove on a plane of the substrate is smaller than an orthographic projection area of the concave groove on the plane of the substrate.

In the OLED display panel of the present invention, an included angle between a bottom surface and a side surface of the concave groove is an obtuse included angle in a longitudinal section of the concave groove.

In the OLED display panel of the present invention, the OLED display panel further comprises an optical glue and a cover plate, the optical glue being disposed on the touch functional layer and filling the concave groove, and the cover plate being disposed on the optical glue.

In the OLED display panel of the present invention, the TFT structure layer comprises a buffer layer, an active layer, a first gate insulating layer, a first gate metal layer, a second gate insulating layer, a second gate metal layer, a third insulating layer, a source/drain metal layer, and a planarization layer sequentially disposed on the substrate; the light emitting functional layer comprises a first electrode, a pixel isolation layer, a light emitting layer, and a second electrode layer sequentially disposed on the planarization layer; and the light transmission area comprises the buffer layer, the first gate insulating layer, the second gate insulating layer, and the third insulating layer of the TFT structure layer, and the concave groove penetrating through the encapsulation layer, the light emitting functional layer, and the planarization layer.

In the OLED display panel of the present invention, the display region comprises the buffer layer, the active layer, the first gate insulating layer, the first gate metal layer, and the second gate insulating layer, the second gate metal layer, the third insulating layer, the source/drain metal layer and the planarization layer of the TFT structure layer, and comprises the first electrode, the pixel isolation layer, the light emitting layer and the second electrode layer of the light emitting functional layer, wherein the encapsulation layer is disposed on the second electrode layer.

Another embodiment of the present invention provides an organic light emitting diode (OLED) display panel, comprising a thin film transistor (TFT) structure layer, a light emitting functional layer and an encapsulation layer sequentially disposed on a substrate, wherein the OLED display panel comprises a light transmission area and a display area surrounding a periphery of the light transmission area; and a concave groove is disposed in the OLED display panel corresponding to the light transmission area, and the concave groove penetrates through the first electrode and the second electrode of the light emitting functional layer to improve transparency of the light transmission area.

In the OLED display panel of the present invention, the TFT structure layer comprises a buffer layer, an active layer, a first gate insulating layer, a first gate metal layer, a second gate insulating layer, a second gate metal layer, a third insulating layer, a source/drain metal layer, and a planarization layer sequentially disposed on the substrate; the light emitting functional layer comprises a first electrode, a pixel isolation layer, a light emitting layer, and a second electrode layer sequentially disposed on the planarization layer; and the light transmission area comprises the buffer layer, the first gate insulating layer, the second gate insulating layer, and the third insulating layer of the TFT structure layer, and the concave groove penetrating through the encapsulation layer, the light emitting functional layer, and the planarization layer.

In the OLED display panel of the present invention, the display region comprises the buffer layer, the active layer, the first gate insulating layer, the first gate metal layer, and the second gate insulating layer, the second gate metal layer, the third insulating layer, the source/drain metal layer and the planarization layer of the TFT structure layer, and comprises the first electrode, the pixel isolation layer, the light emitting layer and the second electrode layer of the light emitting functional layer, wherein he encapsulation layer is disposed on the second electrode layer.

In the OLED display panel of the present invention, the OLED display panel comprises a substrate, wherein the substrate comprises a first portion and a second portion, the first portion corresponds to the display area, the second portion corresponds to the light transmission area, and a thickness of the second portion is less than a thickness of the first portion In the OLED display panel of the present invention, a convex groove protrudes from a bottom surface of the substrate corresponding to the light transmission area to form the second portion.

In the OLED display panel of the present invention, a touch functional layer is disposed on the encapsulation layer, and the touch functional layer covers the display area, and at least a part of the touch functional layer extends from the display area toward the concave groove and covers the concave groove.

In the OLED display panel of the present invention, the touch functional layer comprises a first insulating layer, a first touch electrode, a second insulating layer and a second touch electrode, wherein the first insulating layer is disposed on the encapsulation layer, the first touch electrode is disposed on the first insulating layer, the second insulating layer is disposed on the first touch electrode, and the second touch electrode is disposed on the second insulating layer; herein the first insulating layer or/and the second insulating layer covers the concave groove.

In the OLED display panel of the present invention, the first insulating layer or/and the second insulating layer is a multilayered structure or a single layer structure.

In the OLED display panel of the present invention, the convex groove and the concave groove are disposed on a same central axis.

In the OLED display panel of the present invention, an orthographic projection area of the convex groove on a plane of the substrate is smaller than an orthographic projection area of the concave groove on the plane of the substrate.

In the OLED display panel of the present invention, an included angle between a bottom surface and a side surface of the concave groove is an obtuse included angle in a longitudinal section of the concave groove.

In the OLED display panel of the present invention, the OLED display panel further comprises an optical glue and a cover plate, the optical glue being disposed on the touch functional layer and filling the concave groove, and the cover plate being disposed on the optical glue.

The present invention also relates to an organic light emitting diode (OLED) display device comprising the OLED display panel described above and an optical device disposed under the light transmission area.

The optical device is selected from one of a flash lamp, a camera, an infrared sensor, and an optical fingerprint identification device.

Compared with the OLED display panel of the prior art, the OLED display panel and the OLED display device of the present invention remove the first electrode and the second electrode of the light emitting functional layer by providing the concave groove in the light transmission area, thereby improving the transparency of the light transmission area, and provide a convex groove on the substrate corresponding to the light transmission area to form a second portion, thereby reducing the thickness of the substrate corresponding to the light transmission area, improving the transparency of the second portion. In addition, the first insulating layer or/and the second insulating layer of the touch functional layer cover the concave groove, thereby improving the encapsulation effect, and solving the technical problem that the existing OLED display panel cannot avoid lateral erosion of an OLED electrode and material by water and oxygen after an opening process of the display panel.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
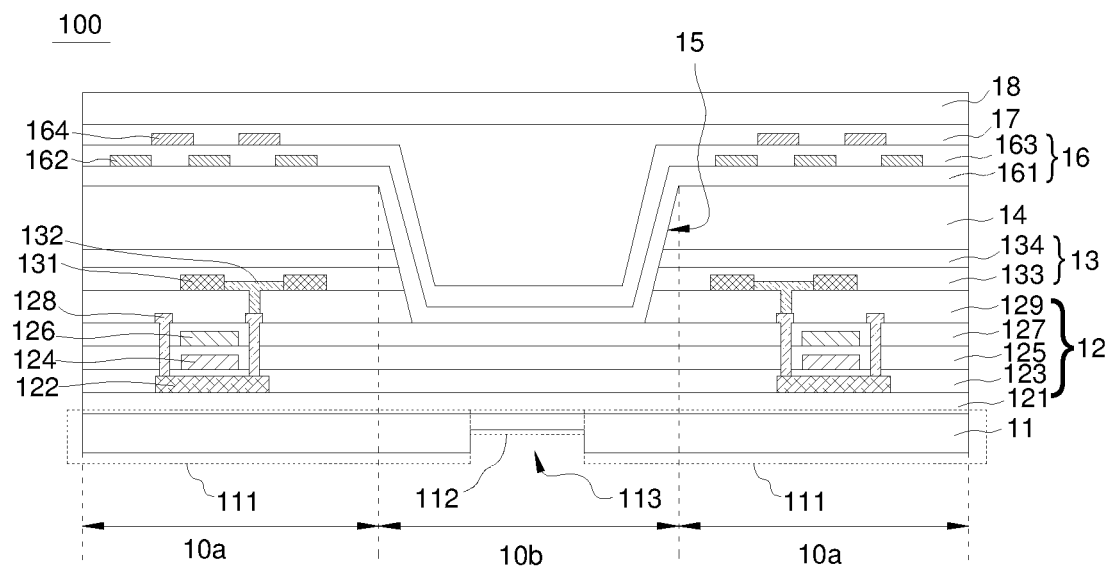
FIG. 1 is a schematic structural view of an organic light emitting diode (OLED) display panel of an embodiment of the present invention.

Please refer to the figures in the drawings, in which the same reference numerals represent the same components. The following description is based on the specific embodiments of the present invention as illustrated, and should not be construed as limiting the specific embodiments that are not described herein.

Please refer to FIG. 1. FIG. 1 shows a schematic structural diagram of an embodiment of an organic light emitting diode (OLED) display panel of the present invention. The OLED display panel 100 of an embodiment of the present invention includes a thin film transistor (TFT) structure layer 12, a light emitting functional layer 13, and an encapsulation layer 14 which are sequentially disposed on the substrate 11.

The OLED display panel 100 includes a light transmission area 10b and a display area 10a surrounding a periphery of the light transmission area 10b.

A concave groove 15 is disposed in the OLED display panel 100 corresponding to the light transmission area 10b, and the concave groove 15 penetrates through at least the encapsulation layer 14, the light emitting functional layer 13 and a part of the TFT structure layer 12.

A touch functional layer 16 is disposed on the encapsulation layer 14, wherein the touch functional layer 16 covers the display area 10a, and at least a part of the touch functional layer 16 extends from the display area 10a toward the concave groove 15 and covers the concave groove 15.

The OLED display panel 100 of the present invention removes the first electrode 131 and the second electrode 134 of the light emitting functional layer 13 by providing the concave groove 15 in the light transmission area 10b, thereby improving the transparency of the light transmission area 10b, and provide a convex groove 15 on the substrate 11 corresponding to the light transmission area 10b to form a second portion 112, thereby reducing the thickness of the substrate 11 corresponding to the light transmission area 10b, improving the transparency of the second portion 112. The light transmission area 10b does not emit light.

In some embodiments, the convex groove penetrates through the encapsulation layer, and because the convex groove penetrates only through the encapsulation layer, the TFT structure layer and the light emitting functional layer in the light transmission area are intact, and thus the light transmission area has a light emitting function.

Alternatively, the convex groove may only penetrate through the encapsulation layer, and the light transmission area may not include an anode, a cathode, and an organic light emitting layer of the light emitting functional layer, or even metal film layers (such as a gate metal layer and source and drain metal layer etc.) in the TFT structure layer. In this case, the light transmission area does not have a light emitting function.

In addition, in this embodiment, the encapsulation effect is improved by covering the convex groove 15 with the first insulating layer 161 or/and the second insulating layer 163 of the touch functional layer 16, and water oxygen is prevented from invading the display region 10a from the convex groove 15.

In some embodiments, the TFT structure layer 12 includes a buffer layer 121, an active layer 122, a first gate insulating layer 123, a first gate metal layer 124, and a second gate insulating layer 125, a second gate metal layer 126, a third insulating layer 127, a source/drain metal layer 128, and a planarization layer 129, which are sequentially disposed on the substrate 11. The light emitting functional layer 13 includes a first electrode 131, a pixel isolation layer 132, a light emitting layer 133, and a second electrode layer 134 which are sequentially disposed on the planarization layer 129.

The display region 10a includes a substrate 11, a buffer layer 121 of the TFT structure layer 12, an active layer 122, a first gate insulating layer 123, a first gate metal layer 124, a second gate insulating layer 125, and a second gate metal. The layer 126, the third insulating layer 127, the source/drain metal layer 128, the planarization layer 129 of the TFT structure layer 12, and includes the first electrode 131, the pixel isolation layer 132, the light emitting layer 133, and the second electrode layer 134 of the light emitting functional layer 13.

The encapsulation layer 14 is disposed on the second electrode layer 134.

The light transmission area 10b includes a substrate 11, a buffer layer 121, a first gate insulating layer 123, a second gate insulating layer 125, and a third insulating layer 127 of the TFT structure layer 12. The concave groove 15 penetrates through the encapsulation layer 14, the light emitting functional layer 13, and the planarization layer 129.

In other embodiments, the convex groove penetrates through the encapsulation layer, the light emitting functional layer, the planarization layer, and through any of the layers between the planarization layer and the substrate from top to bottom. The structure corresponding to the light transmission area is also slightly adjusted by increasing or decreasing numbers of the layers.

In some embodiments, the substrate 11 is a flexible substrate of polyimide or polyester. The buffer layer 121, the first gate insulating layer 123, the second gate insulating layer 125, and the third insulating layer 127 are each made of an inorganic material such as SiNx/SiOx. The active layer 122 is made of low temperature polysilicon. The first gate metal layer 124 and the second gate metal layer 126 are made of a metal material such as Mo. The source/drain metal layer 128 is made of Ti/Al/Ti. The planarization layer 129 is made of a polyimide-based material.

The first electrode 131 is made of ITO/Ag/ITO or IZO/Ag/IZO. The pixel isolation layer 132 is made of a polyimide-based material. The light emitting layer 133 is made of a small molecule or a polymer. The second electrode 134 is made of Mg/Ag.

The encapsulation layer 14 is formed by alternately superposing an inorganic layer and an organic layer.

In some embodiments, the touch functional layer 16 includes a first insulating layer 161, a first touch electrode 162, a second insulating layer 163, and a second touch electrode 164. The first insulating layer 161 is disposed on the encapsulation layer 14. The first touch electrode 162 is disposed on the first insulating layer 161. The second insulating layer 163 is disposed on the first touch electrode 162. The second touch electrode 164 is disposed on the second insulating layer 163.

The first insulating layer 161 or/and the second insulating layer 163 cover the convex groove 15. Covering the convex groove 15 with the first insulating layer 161 or/and the second insulating layer 163 serves to encapsulate the convex groove 15 to prevent water oxygen from invading the display region 10a from the convex groove 15.

The first insulating layer 161 and the second insulating layer 163 together cover the convex groove 15, which improves encapsulation effect for the convex groove 15, thereby improving the performance of preventing water oxygen from invading the display area 10a.

In some embodiments, the first insulating layer 161 or/and the second insulating layer 163 is a multilayered structure or a single layer structure. When the first insulating layer 161 and the second insulating layer 163 have a multilayered structure, the encapsulation effect is improved.

In some embodiments, the first insulating layer 161 and the second insulating layer 163 are made of SiNx or SiONx. The first touch electrode 162 and the second touch electrode 164 are made of Mo, Ag, Ti, Cu, Al, Mo/Al/Mo or Ti/Al/Ti.

In some embodiments, the OLED display panel 100 includes a substrate 11 including a first portion 111 and a second portion 112. The first portion 111 corresponds to the display area 10a. The second portion 112 corresponds to the light transmission area 10b. A thickness of the second portion 112 is less than a thickness of the first portion 111. Such an arrangement is to reduce a thickness of the substrate 11 at the light transmission area 10b, thereby improving the transparency of the second portion.

In some embodiments, a convex groove 113 protrudes from a bottom surface of the substrate 11 corresponding to the light transmission area 10b to form the second portion 112.

In some embodiments, the convex groove 113 and the concave groove 15 are disposed on a same central axis. When an optical device, such as a camera, an optical fingerprint recognition module, or the like needs to be disposed under the light transmission area 10b, an arrangement of the convex groove 113 and the concave groove 15 on a same central axis facilitates uniform reception of light by the optical device. That is, it is advantageous for the optical device to possess a largest receiving surface of light.

In some embodiments, an orthographic projection area of the convex groove 113 on a plane of the substrate 11 is smaller than an orthographic projection area of the concave groove 15 on the plane of the substrate 11. When the optical device, such as a camera, or an optical fingerprint recognition module etc., needs to be disposed under the light transmissive area 10b, the setting of the above-mentioned area relationship facilitates the optical device to receive more light.

In some embodiments, an included angle between a bottom surface and a sidewall surface of the concave groove 15 is an obtuse included angle in a longitudinal section of the concave groove. That is, the concave groove 15 has a narrow top and a wide bottom, which is advantageous for depositing the first insulating layer 161 and the third insulating layer 163 on the one hand, and improving the light extraction rate on the other hand.

In some embodiments, the OLED display panel 100 further includes an optical glue 17 and a cover plate 18. The optical glue 17 is disposed on the touch function layer 16 and fills the convex groove 15. The cover plate 18 is disposed on the optical glue 17. The optical glue 17 is made of an organic transparent material, such as epoxy resin, silicone, or acrylic.

Figure 2:
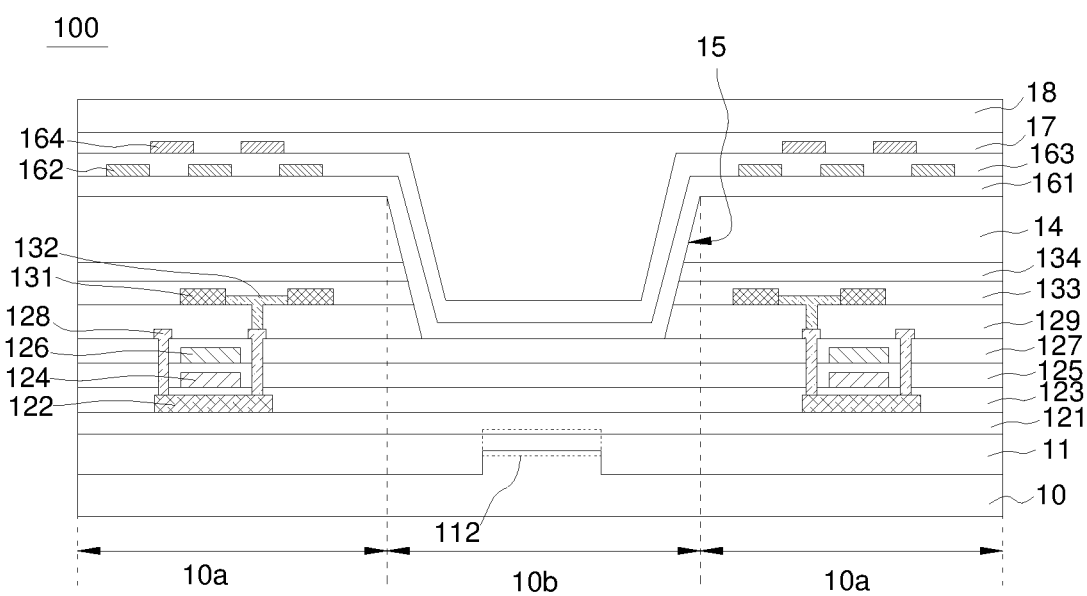
FIG. 2 is a schematic structural view of an organic light emitting diode (OLED) display panel formed on a glass substrate of an embodiment of the present invention.

Please refer to FIG. 2, which shows a schematic structural view of an embodiment of an OLED display panel formed on a glass substrate according to the present invention. Processes of preparing the OLED display panel 100 in this embodiment is as follows.

First, a glass substrate 10 is provided, which is provided with a convex structure corresponding to the light transmission area 10b of a substrate 11;

Then, the substrate 11, a buffer layer 121, an active layer 122, a first gate insulating layer 123, a first gate metal layer 124, a second gate insulating layer 125, a second gate metal layer 126, a third insulating layer 127, a source/drain metal layer 128, a planarization layer 129, a first electrode 131, a pixel isolation layer 132, a light emitting layer 133, a second electrode 134, and an encapsulation layer 14 are sequentially formed on the glass substrate 10.

Next, at a position corresponding to the light transmission area 10b, a recessing process is performed to remove films from the planarization layer 129 to the encapsulation layer 14 in the light transmission area 10b to form a concave groove 15.

Then, a first insulating layer 161, a first touch electrode 162, a second insulating layer 163, and a second touch electrode 164 are sequentially formed on the encapsulation layer 14 to form a touch functional layer 16. The first insulating layer 161 and the second insulating layer 163 continuously cover the concave groove 15 and a non-groove area.

Next, an optical glue 17 is coated on the touch functional layer 16, and the optical glue 17 is filled in the concave groove 15. A cover plate 18 is provided on the optical glue 17.

Finally, the glass substrate 10 is peeled off from the substrate 11 by a laser lift-off process to form the display panel 100 of the present embodiment.

As such, the preparation process of this embodiment is completed.

Figure 3:
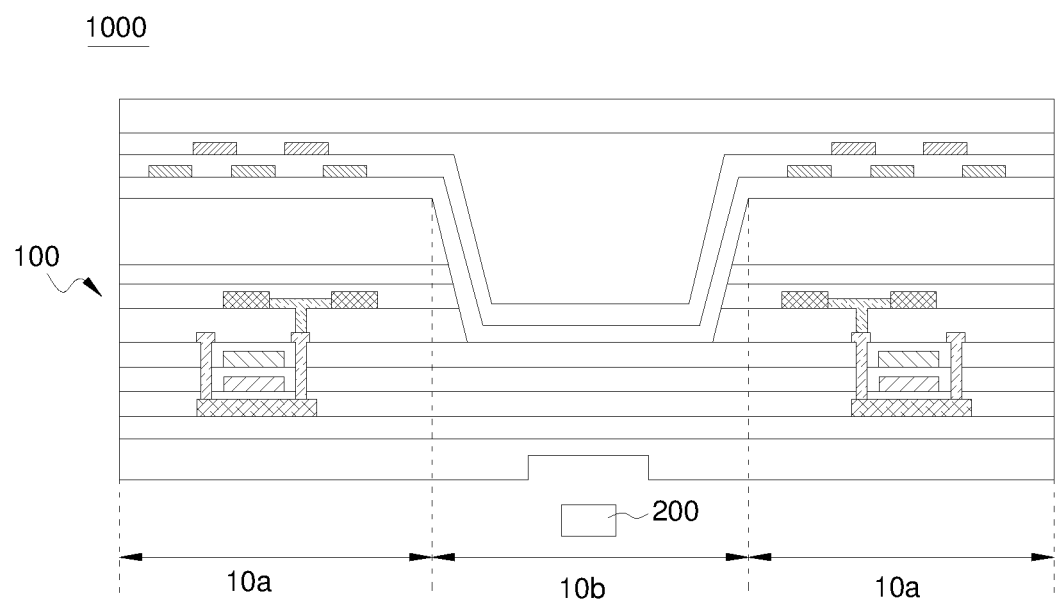
FIG. 3 is a schematic structural view of an organic light emitting diode (OLED) display device of an embodiment of the present invention.

Please refer to FIG. 3, which shows a schematic structural diagram of an embodiment of an organic light emitting diode (OLED) display device of the present invention. The present invention also relates to an organic light emitting diode (OLED) display device 1000 including the OLED display panel 100 of the above-described invention embodiment and an optical device 200 disposed under the light transmission area 10b. The OLED display panel 100 includes a display area 10a and a light transmission area 10b.

The optical device 200 is selected from one of a flash lamp, a camera, an infrared sensor, and an optical finger-printing device.

A structure of the display panel 100 of the OLED display device 1000 of the present invention is the same as that of the display panel of the above embodiment, and details are not described herein again for brevity.

Compared with the OLED display panel of the prior art, the OLED display panel and the OLED display device of the present invention remove the first electrode and the second electrode of the light emitting functional layer by providing the concave groove in the light transmission area, thereby improving the transparency of the light transmission area, and provide a convex groove on the substrate corresponding to the light transmission area to form a second portion, thereby reducing the thickness of the substrate corresponding to the light transmission area, improving the transparency of the second portion. In addition, the first insulating layer or/and the second insulating layer of the touch functional layer cover the concave groove, thereby improving the encapsulation effect, and solving the technical problem that the existing OLED display panel cannot prevent water and oxygen from eroding an OLED electrode and material from a lateral side after an opening process of the display panel.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting diode (OLED) display panel, comprising a thin film transistor (TFT) structure layer, a light emitting function layer, and an encapsulation layer sequentially disposed on a substrate, wherein
the OLED display panel comprises a light transmission area and a display area surrounding a periphery of the light transmission area;
a concave groove is disposed in the OLED display panel corresponding to the light transmission area, and the concave groove penetrates through at least the encapsulation layer, the light emitting function layer, and a part of the TFT structure layer; and
a touch function layer is disposed on the encapsulation layer, wherein the touch function layer covers the display area, and at least a part of the touch function layer extends from the display area toward the concave groove and covers the concave groove;
the OLED display panel comprises a substrate, wherein the substrate comprises a first portion and a second portion, the first portion corresponds to the display area, the second portion corresponds to the light transmission area, and a thickness of the second portion is less than a thickness of the first portion;
wherein the touch function layer comprises a first insulating layer, a first touch electrode, a second insulating layer, and a second touch electrode, wherein the first insulating layer is disposed on the encapsulation layer, the first touch electrode is disposed on the first insulating layer, the second insulating layer is disposed on the first touch electrode, and the second touch electrode is disposed on the second insulating layer; and
wherein the first insulating layer conformally covers a bottom surface and side surfaces of the concave groove.

2. The OLED display panel according to claim 1, wherein a convex groove protrudes from a bottom surface of the substrate corresponding to the light transmission area to form the second portion.

3. The OLED display panel according to claim 2, wherein the convex groove and the concave groove are disposed on a same central axis.

4. The OLED display panel according to claim 2, wherein an orthographic projection area of the convex groove on a plane of the substrate is smaller than an orthographic projection area of the concave groove on the plane of the substrate.

5. The OLED display panel according to claim 1, wherein an included angle between a bottom surface and a sidewall surface of the concave groove is an obtuse angle in a longitudinal section of the concave groove.

6. The OLED display panel according to claim 1, wherein
the TFT structure layer comprises a buffer layer, an active layer, a first gate insulating layer, a first gate metal layer, a second gate insulating layer, a second gate metal layer, a third insulating layer, a source/drain metal layer, and a planarization layer sequentially disposed on the substrate;
the light emitting function layer comprises a first electrode, a pixel isolation layer, a light emitting layer, and a second electrode layer sequentially disposed on the planarization layer; and
the light transmission area comprises the buffer layer, the first gate insulating layer, the second gate insulating layer, and the third insulating layer of the TFT structure layer, and the concave groove penetrates through the encapsulation layer, the light emitting function layer, and the planarization layer.

7. An organic light-emitting diode (OLED) display device, comprising the OLED display panel according to claim 1 and an optical device disposed under the light transmission area.

8. An organic light-emitting diode (OLED) display panel, comprising a thin film transistor (TFT) structure layer, a light emitting function layer and an encapsulation layer sequentially disposed on a substrate, wherein
the OLED display panel comprises a light transmission area and a display area surrounding a periphery of the light transmission area; and a concave groove is disposed in the OLED display panel corresponding to the light transmission area, and the concave groove penetrates through at least the encapsulation layer, wherein a touch function layer is disposed on the encapsulation layer, and the touch function layer covers the display area, and at least a part of the touch function layer extends from the display area toward the concave groove and covers the concave groove;

wherein the touch function layer comprises a first insulating layer, a first touch electrode, a second insulating layer, and a second touch electrode, wherein the first insulating layer is disposed on the encapsulation layer, the first touch electrode is disposed on the first insulating layer, the second insulating layer is disposed on the first touch electrode, and the second touch electrode is disposed on the second insulating layer; and wherein the first insulating layer conformally covers a bottom surface and side surfaces of the concave groove.

9. The OLED display panel according to claim 8, wherein the concave groove further penetrates through the light emitting function layer and a part of the TFT structure layer.

10. The OLED display panel according to claim 8, wherein the first insulating layer or/and the second insulating layer is a multilayered structure or a single layer structure.

11. The OLED display panel according to claim 8, wherein the OLED display panel comprises a substrate, and the substrate comprises a first portion and a second portion, the first portion corresponding to the display area, the second portion corresponding to the light transmission area; and a thickness of the second portion is less than a thickness of the first portion.

12. The OLED display panel according to claim 11, wherein a convex groove protrudes from a bottom surface of the substrate corresponding to the light transmission area to form the second portion.

13. The OLED display panel according to claim 12, wherein the convex groove and the concave groove are disposed on a same central axis.

14. The OLED display panel according to claim 13, wherein an orthographic projection area of the convex groove on a plane of the substrate is smaller than an orthographic projection area of the concave groove on the plane of the substrate.

15. The OLED display panel according to claim 8, wherein an angle between a bottom surface and a side surface of the concave groove is an obtuse angle in a longitudinal section of the concave groove.

16. The OLED display panel according to 8, wherein the OLED display panel further comprises an optical glue and a cover plate, the optical glue disposed on the touch function layer and filling the concave groove, and the cover plate disposed on the optical glue.

17. The OLED display panel according to claim 8, wherein the TFT structure layer comprises a buffer layer, an active layer, a first gate insulating layer, a first gate metal layer, a second gate insulating layer, a second gate metal layer, a third insulating layer, a source/drain metal layer, and a planarization layer sequentially disposed on the substrate;

the light emitting functional layer comprises a first electrode, a pixel isolation layer, a light emitting layer, and a second electrode layer sequentially disposed on the planarization layer; and the light transmission area comprises the buffer layer, the first gate insulating layer, the second gate insulating layer, and the third insulating layer of the TFT structure layer, and the groove penetrating through the encapsulation layer, the light emitting functional layer, and the planarization layer.

18. The OLED display panel according to claim 17, wherein the display region comprises the buffer layer, the active layer, the first gate insulating layer, the first gate metal layer, and the second gate insulating layer, the second gate metal layer, the third insulating layer, the source/drain metal layer and the planarization layer of the TFT structure layer, and comprises the first electrode, the pixel isolation layer, the light emitting layer and the second electrode layer of the light emitting function layer, wherein the encapsulation layer is disposed on the second electrode layer.

* * * * *